(12) United States Patent
Kenzaki et al.

(10) Patent No.: US 10,641,814 B2
(45) Date of Patent: May 5, 2020

(54) PROBE STRUCTURE

(71) Applicant: Murata Manufacturing Co., Ltd., Kyoto-fu (JP)

(72) Inventors: Shinichi Kenzaki, Nagaokakyo (JP); Yukihiro Kitaichi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/449,177

(22) Filed: Jun. 21, 2019

(65) Prior Publication Data
US 2019/0310301 A1 Oct. 10, 2019

Related U.S. Application Data

(63) Continuation of application No. PCT/JP2017/034787, filed on Sep. 26, 2017.

(30) Foreign Application Priority Data

Dec. 22, 2016 (JP) .................. 2016-249796

(51) Int. Cl.
*G01R 31/20* (2006.01)
*G01R 31/04* (2006.01)
(Continued)

(52) U.S. Cl.
CPC ......... *G01R 31/043* (2013.01); *G01R 1/0416* (2013.01); *G01R 1/067* (2013.01);
(Continued)

(58) Field of Classification Search
CPC .............. G01R 1/0416; G01R 1/07307; G01R 1/07392; G01R 1/067; G01R 1/06722;
(Continued)

(56) References Cited

U.S. PATENT DOCUMENTS 5,641,315 A 6/1997 Swart et al.
5,940,559 A * 8/1999 Noll ....................... G01M 11/33
  385/53

(Continued)

FOREIGN PATENT DOCUMENTS

JP  2002-005959 A  1/2002
JP  2002-530841 A  9/2002
(Continued)

OTHER PUBLICATIONS

International Search Report issued in PCT/JP2017/034787; dated Dec. 26, 2017.
(Continued)

*Primary Examiner* — Thang X Le
(74) *Attorney, Agent, or Firm* — Studebaker & Brackett PC

(57) ABSTRACT

A probe structure for inspecting characteristics of a connector having at least one terminal includes a plunger, a coaxial probe, a flange, a housing, and a spring. A first end portion of the housing and the flange are configured to restrict rotation of the housing in the circumferential direction in a state in which the first end portion of the housing is fitted into the through-hole of the flange. Thus, inspection of characteristics of the terminal of the connector can be performed with higher accuracy.

6 Claims, 18 Drawing Sheets

(51) Int. Cl.
 *G01R 1/04*      (2006.01)
 *G01R 1/073*     (2006.01)
 *H01R 13/15*     (2006.01)
 *H01R 13/24*     (2006.01)
 *G01R 1/067*     (2006.01)
 *H01R 24/38*     (2011.01)

(52) U.S. Cl.
 CPC ......... *G01R 1/073* (2013.01); *G01R 1/07392* (2013.01); *H01R 13/15* (2013.01); *H01R 13/24* (2013.01); *H01R 24/38* (2013.01)

(58) Field of Classification Search
 CPC .............................................. G01R 1/06788; G01R 1/06794; G01R 13/15; G01R 13/24; G01R 31/043; G01R 31/045; G01R 31/11
 See application file for complete search history.

(56) References Cited

U.S. PATENT DOCUMENTS

2003/0042883 A1* 3/2003 Thurston ............ G01R 1/06772
                324/72.5
2005/0212541 A1* 9/2005 Ruff ................... G01R 1/06788
                324/755.02
2008/0299823 A1* 12/2008 Peng ...................... H01R 27/02
                439/578

FOREIGN PATENT DOCUMENTS

| JP | 2003-123910 A | 4/2003 |
| JP | 2007-017448 A | 1/2007 |
| WO | 2016/072187 A1 | 5/2016 |
| WO | 2016/072193 A1 | 5/2016 |

OTHER PUBLICATIONS

Written Opinion issued in PCT/JP2017/034787; dated Dec. 26, 2017.

Hirotaka Toda; "Multi Line Connectors for Mobile Devices"; online; Jun. 15, 2017; pp. 25-27; URL: https://www.murata.com/~/media/webrenewal/about/newsroom/tech/connectors/ta16f1.ashx?la=en-us.

* cited by examiner

PROBE STRUCTURE

CROSS-REFERENCE TO RELATED APPLICATIONS

This application claims benefit of priority to International Patent Application No. PCT/JP2017/034787, filed Sep. 26, 2017, and to Japanese Patent Application No. 2016-249796, filed Dec. 22, 2016, the entire contents of each are incorporated herein by reference.

BACKGROUND

Technical Field

The present disclosure relates to a probe structure for a connector.

Background Art

To date, probe structures for inspecting characteristics of a connector, which is an inspection target, have been disclosed as described, for example, in International Publication No. 2016/072193.

The probe structure described in International Publication No. 2016/072193 is a probe structure for inspecting characteristics of a coaxial connector, in particular, for inspecting characteristics of a multipole connector having a plurality of terminals so that the connector can pass a plurality of signals. The probe structure described in International Publication No. 2016/072193 includes a plurality of center conductors that can simultaneously contact the plurality of terminals of the multipole connector.

SUMMARY

For a probe structure for a connector, improvement of the accuracy of inspection of characteristics of terminals is required. With the probe structure described in International Publication No. 2016/072193, with which the plurality of center conductors simultaneously contact the plurality of terminals, displacement between the terminals and the center conductors tends to occur, and the accuracy of inspection of characteristics tends to decrease. Regarding probe structures, including the one described in International Publication No. 2016/072193, development of technology that allows inspection of characteristics of terminals to be performed with higher accuracy is required.

Accordingly, the present disclosure provides a probe structure that allows inspection of characteristics of terminals of a connector to be performed with higher accuracy.

The probe structure according to the present disclosure is a probe structure for inspecting characteristics of a connector including at least one terminal. The probe structure includes a plunger that includes a groove portion to which the connector is to be fitted; a coaxial probe that is inserted into the plunger and that allows a conductor pin to be exposed at a position corresponding to the terminal of the connector that is fitted into the groove portion of the plunger; and a flange that is fixed to an apparatus for inspecting the characteristics at a position that is spaced apart on a side opposite to a side on which the conducting pin is exposed with respect to the plunger. The flange has a through-hole into which the coaxial probe is inserted. The probe structure also includes a housing that includes a first end portion and a second end portion and that extends toward the plunger while surrounding the coaxial probe. The first end portion is fitted into the through-hole of the flange from a side opposite to a side on which the plunger is disposed, and the second end portion is attached to the plunger. The probe structure further includes a spring that is attached to a portion between the plunger and the flange, that is disposed at a position surrounding the housing, and that urges the plunger in a direction away from the flange. The first end portion of the housing and the through-hole of the flange have outer shapes that restrict rotation of the housing in a circumferential direction in a state in which the first end portion of the housing is fitted into the through-hole of the flange.

With the probe structure according to the present disclosure, it is possible to inspect characteristics of terminals of a connector with higher accuracy.

BRIEF DESCRIPTION OF THE DRAWINGS

These aspects and features of the present disclosure will be elucidated from the following description of preferred embodiments with reference to the attached drawings.

DESCRIPTION OF EMBODIMENTS

Figure 1:
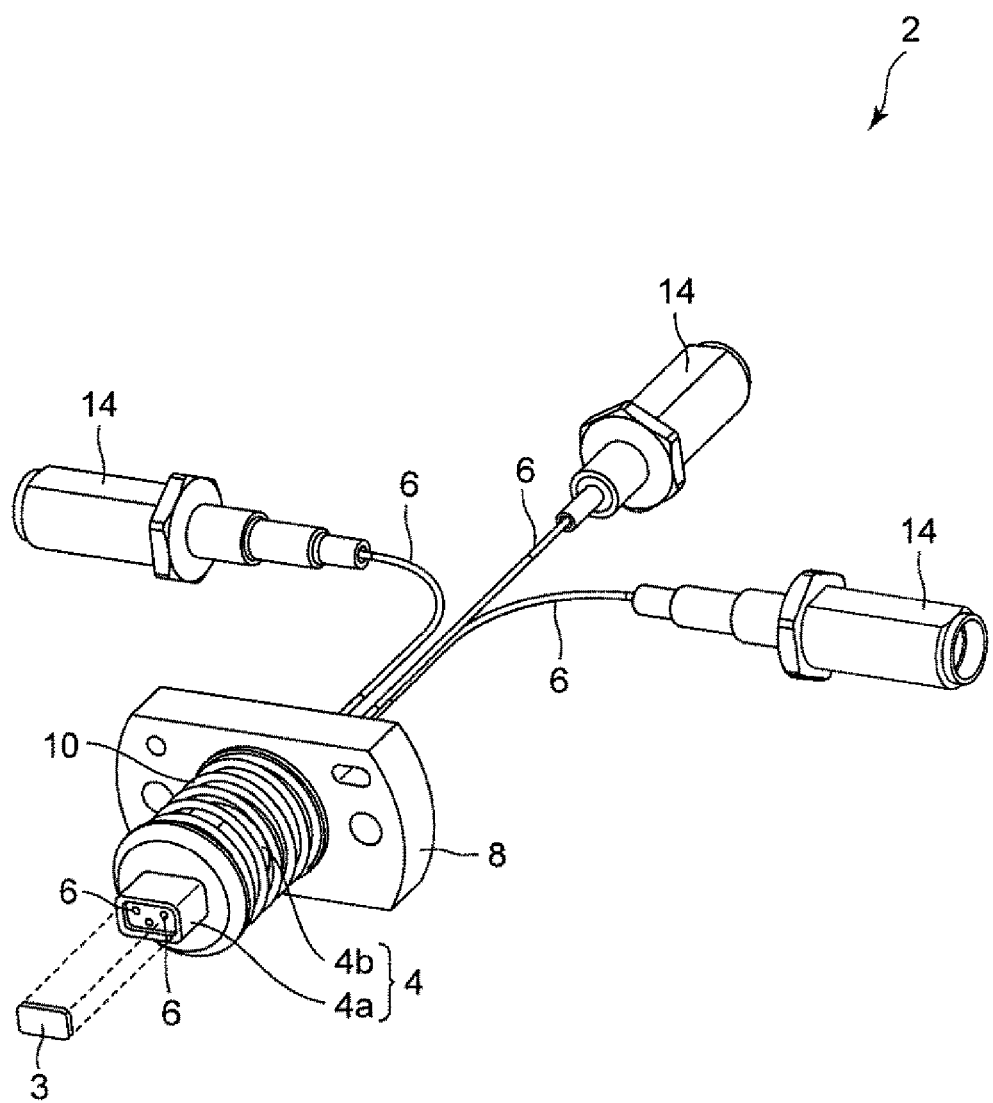
FIG. 1 is a schematic perspective view of a probe structure according to a first embodiment.

According to a first aspect of the present disclosure, there is provided a probe structure for inspecting characteristics of a connector including at least one terminal. The probe structure includes a plunger that includes a groove portion to which the connector is to be fitted; a coaxial probe that is inserted into the plunger and that allows a conductor pin to be exposed at a position corresponding to the terminal of the connector that is fitted into the groove portion of the plunger; and a flange that is fixed to an apparatus for inspecting the characteristics at a position that is spaced apart on a side opposite to a side on which the conducting pin is exposed with respect to the plunger. The flange has a through-hole into which the coaxial probe is inserted. The probe structure also includes a housing that includes a first end portion and a second end portion and that extends toward the plunger while surrounding the coaxial probe. The first end portion is fitted into the through-hole of the flange from a side opposite to a side on which the plunger is disposed, and the second end portion is attached to the plunger. The probe structure further includes a spring that is attached to a portion between the plunger and the flange, that is disposed at a position surrounding the housing, and that urges the plunger in a direction away from the flange. The first end portion of the housing and the through-hole of the flange have outer shapes that restrict rotation of the housing in a circumferential direction in a state in which the first end portion of the housing is fitted into the through-hole of the flange. With such a structure, the plunger and the housing can rotate in accordance with the position of the terminal of the connector, the conductive pin of the coaxial probe can contact the terminal of the connector with high accuracy, and it is possible to improve the reliability of the inspection of characteristics.

According to a second aspect of the present disclosure, there is provided a probe structure according to the first aspect, in which the first end portion of the housing has a tapered shape that tapers inward toward the second end portion, and the through-hole of the flange has an inclined shape that receives the first end portion of the housing. With such a structure, because a rotation-restricting mechanism of the housing is formed by utilizing the outer shapes of the housing and the through-hole of the flange, it is possible to realize the rotation-restricting mechanism of the housing with a simpler structure without providing a projection or the like.

According to a third aspect of the present disclosure, there is provided a probe structure according to the first or second aspect, in which the flange includes a projection on a surface thereof on a side that receives the first end portion of the housing, the projection being located around the through-hole and extending toward the first end portion of the housing, and the first end portion of the housing has a groove into which the projection of the flange is fitted. With such a structure, because a rotation-restricting mechanism of the housing is formed from the groove and the projection, it is possible to more reliably restrict rotation of the housing.

According to a fourth aspect of the present disclosure, there is provided a probe structure according to the third aspect, in which the projection of the flange and the groove of the housing are each formed continuously in the circumferential direction. With such a structure, it is possible to realize a rotation-restricting mechanism of the housing with a simpler structure than in a case where the projection and the groove are each divided into portions that are arranged at a plurality of positions.

According to a fifth aspect of the present disclosure, there is provided a probe structure according to the third aspect, in which the projection of the flange and the groove of the housing are each divided into portions that are arranged at a plurality of positions in the circumferential direction. With such a structure, it is possible to more reliably restrict rotation of the housing.

According to a sixth aspect of the present disclosure, there is provided a probe structure according to any one of the first to fifth aspects, in which a wall portion of the plunger that forms the groove portion includes a bottom wall that allows a tip portion of the conducting pin to be exposed, a first side wall that stands on a periphery of the bottom wall, and a second side wall that stands on a periphery of the first side wall and that is inclined so as to taper inward toward the first side wall. With such a structure, because the connector can be disposed at a desired measurement position with high accuracy, it is possible to inspect characteristics of the terminal of the connector with higher accuracy.

According to a seventh aspect of the present disclosure, there is provided a probe structure according to the sixth aspect, in which an inclination angle of the second side wall is set based on a friction coefficient of a material of the second side wall. With such a structure, the connector can be reliably guided by the second side wall, and it is possible to further improve the positioning accuracy of the connector.

Hereafter, embodiments of the present disclosure will be described in detail with reference to the drawings.

(First Embodiment)

Figure 2:
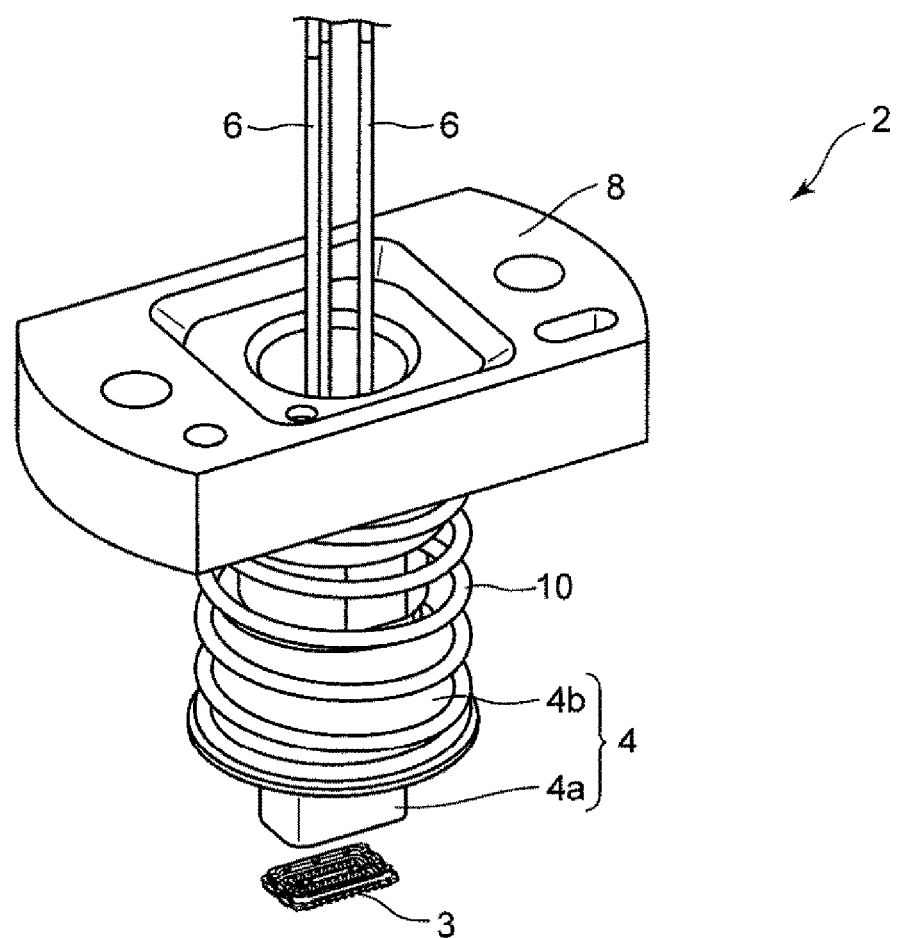
FIG. 2 is a partial schematic perspective view of the probe structure.
Figure 3:
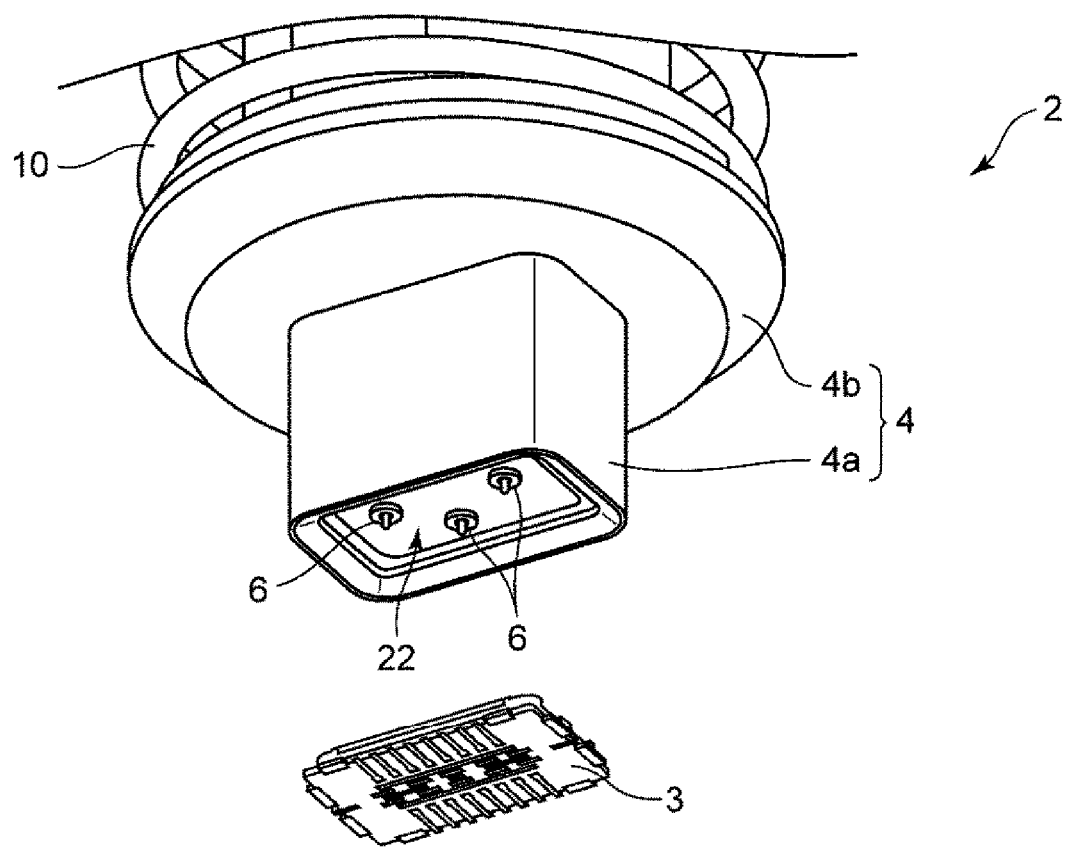
FIG. 3 is a partial schematic perspective view of the probe structure.

FIGS. 1 to 3 are schematic views of a probe structure 2 according to a first embodiment. FIG. 1 is a schematic perspective view of the probe structure 2. FIGS. 2 and 3 are partial schematic perspective views of the probe structure 2.

The probe structure 2 is an inspection device that is used to inspect characteristics of a connector (multipole connector) 3 having a plurality of terminals. The probe structure 2 includes a plunger 4, coaxial probes 6, a flange 8, a spring 10, and connectors 14.

The plunger 4 is a positioning member for positioning the connector 3 by allowing the connector 3 to be fitted thereto. The plunger 4 is made of, for example, SUS. The plunger 4 includes a fitting portion 4a to which the connector 3 is fitted and a tubular portion 4b formed in a tubular shape. The fitting portion 4a is formed so as to protrude from an end of the tubular portion 4b. A groove portion 22 (FIG. 3), which allows the connector 3 to be fitted thereto, is formed in the fitting portion 4a. The structure of the groove portion 22 and surrounding parts will be described below in detail.

The plurality of coaxial probes 6 are inserted into the plunger 4. The coaxial probes 6 are members that contact terminals of the connector 3 to be electrically connected to the terminals. Each of the coaxial probes 6 has a bar-like shape and a tip portion thereof is exposed from the plunger 4.

In the present embodiment, in particular, one probe structure 2 includes the plurality of coaxial probes 6. With such a structure, in a case where the connector 3, which is an inspection target, includes a plurality of terminals, it is possible to simultaneously inspect characteristics of the terminals of the connector 3. In the first embodiment, an example in which the probe structure 2 has three coaxial probes 6 will be described.

The flange 8 is used to attach the probe structure 2 to a predetermined apparatus (such as a screening machine for screening printed circuit boards, on each of which the connector 3 is mounted, based on the result of inspecting characteristics of the connector 3). The flange 8 is fixed to an end of the tubular portion 4b of the plunger 4 opposite to the fitting portion 4a.

The spring 10 is an elastic member for pressing the coaxial probes 6 against the terminals of the connector 3 with an appropriate load. The spring 10, which surrounds the tubular portion 4b of the plunger 4, is attached to a portion between the flange 8 and the fitting portion 4a.

The connectors 14 are used to connect the coaxial probes 6 to an external measurement device (not shown). The first embodiment includes three connectors 14, which respectively correspond to the three coaxial probes 6.

Next, referring to FIGS. 4 and 5, the coaxial probes 6 will be described.

Figure 4:
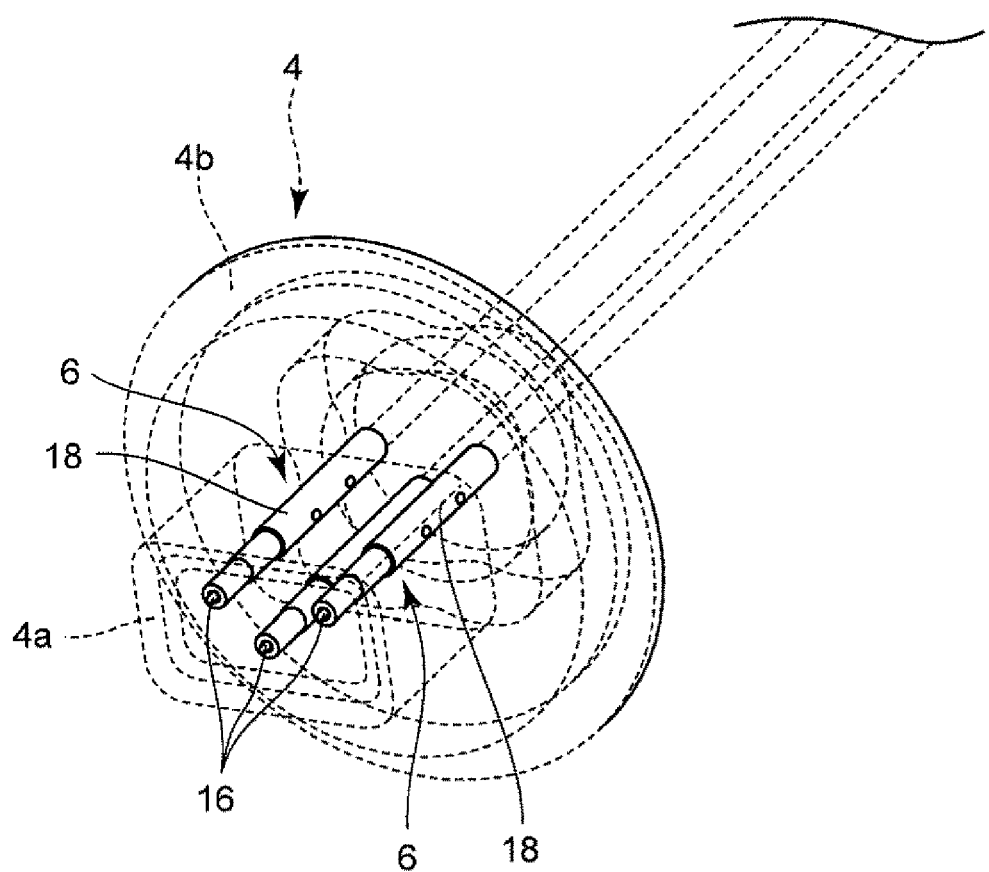
FIG. 4 is a schematic perspective view of a plurality of coaxial probes inserted into a plunger.

FIG. 4 is a schematic perspective view of the plurality of coaxial probes 6 inserted into the plunger 4. FIG. 5 is a schematic perspective view of one of the coaxial probes 6.

Figure 5:
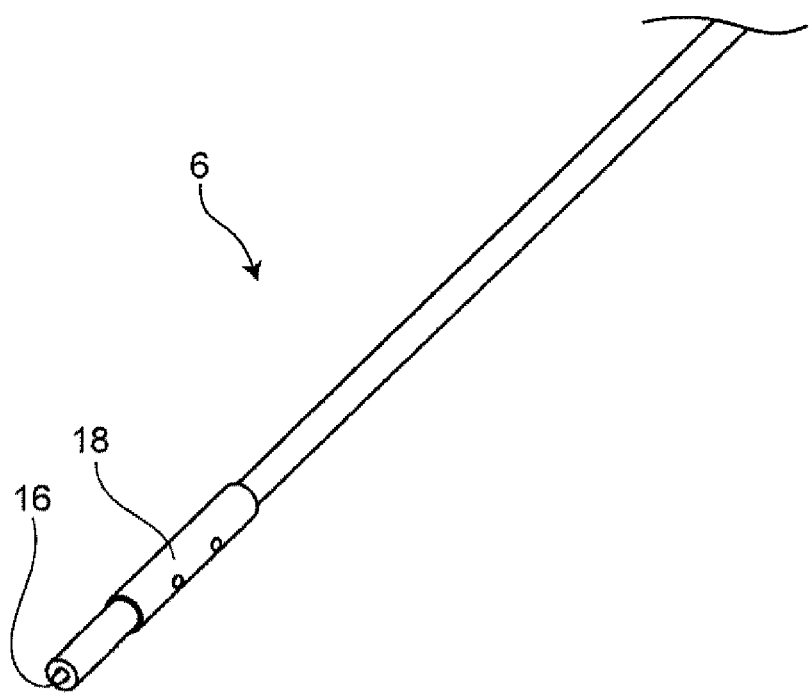
FIG. 5 is a schematic perspective view of one of the coaxial probes.

As illustrated in FIGS. 4 and 5, each of the coaxial probes 6 includes a conducting pin 16 and a barrel 18.

Each of the conducting pins 16 is a bar-shaped member that contacts a corresponding one of the terminals of the connector 3 to be electrically connected to the terminal. The conducting pin 16 is made of an electroconductive material so that the conducting pin 16 can be electrically connected to the terminal of the connector 3. The conducting pin 16 functions as a measurement pin for measuring characteristics of the terminal of the connector 3.

The barrel 18 is a tubular member that covers the periphery of the conducting pin 16. The barrel 18 covers the periphery of the conducting pin 16 in a state in which the barrel 18 is electrically insulated from the conducting pin 16. The barrel 18 is press-fitted into and fixed to the plunger 4. The barrel 18 is made, for example, by forming gold plating on a copper-based material (such as for phosphor bronze).

Next, referring to FIG. 6, the relationship between the coaxial probes 6 and the terminals of the connector 3 will be described.

Figure 6:
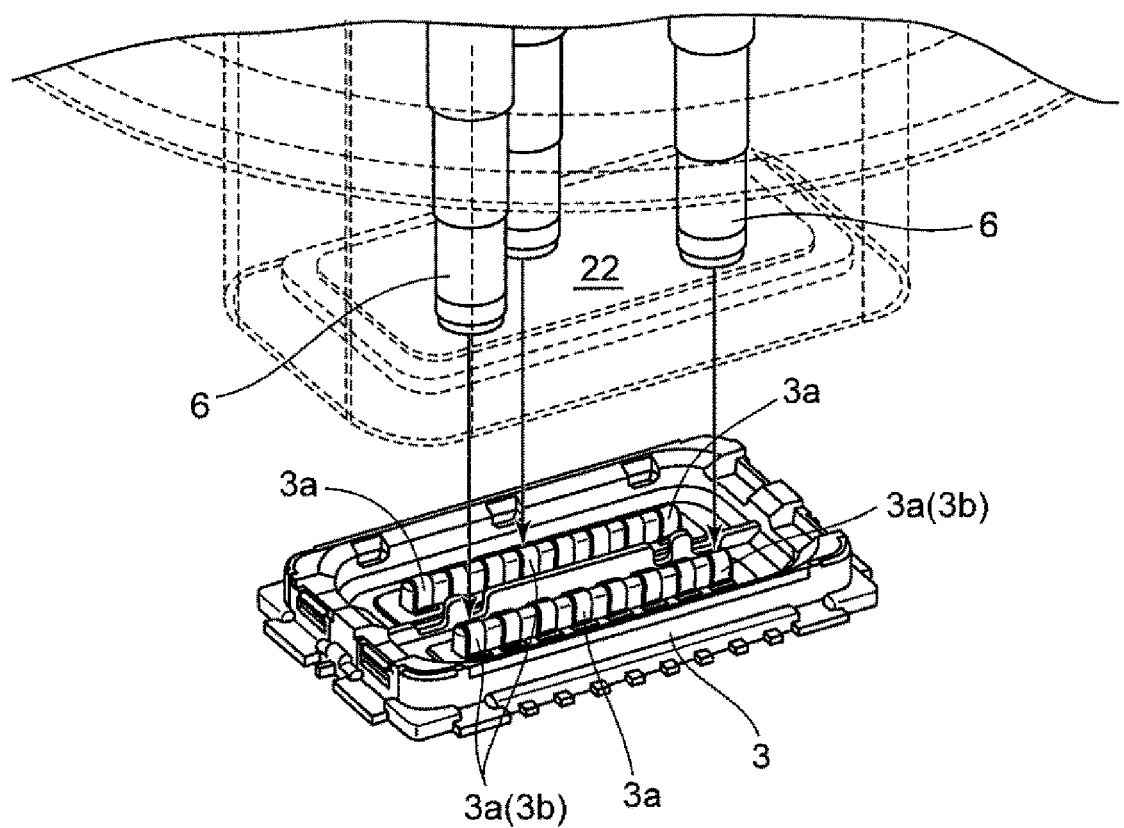
FIG. 6 is a schematic perspective view illustrating the relationship between the coaxial probes and terminals of a multipole connector.

As illustrated in FIG. 6, the connector 3 includes a plurality of terminals 3a. In the first embodiment, the connector 3 has sixteen terminals 3a, including eight terminals 3a that are arranged in two rows. Three coaxial probes 6 are disposed at positions corresponding to three terminals 3b. To be specific, when the connector 3 is disposed in the groove portion 22, the positions of the coaxial probes 6 in the plunger 4 are set so that the tip portions of the conducting pins 16 of the coaxial probes 6 contact the terminals 3b. Thus, it is possible to simultaneously inspect characteristics of the three terminals 3b of the connector 3 by causing the terminals 3b to simultaneously contact the conducting pins 16 of the three coaxial probes 6.

Next, referring to FIG. 7, the structure of the fitting portion 4a of the plunger 4 will be described.

Figure 7:
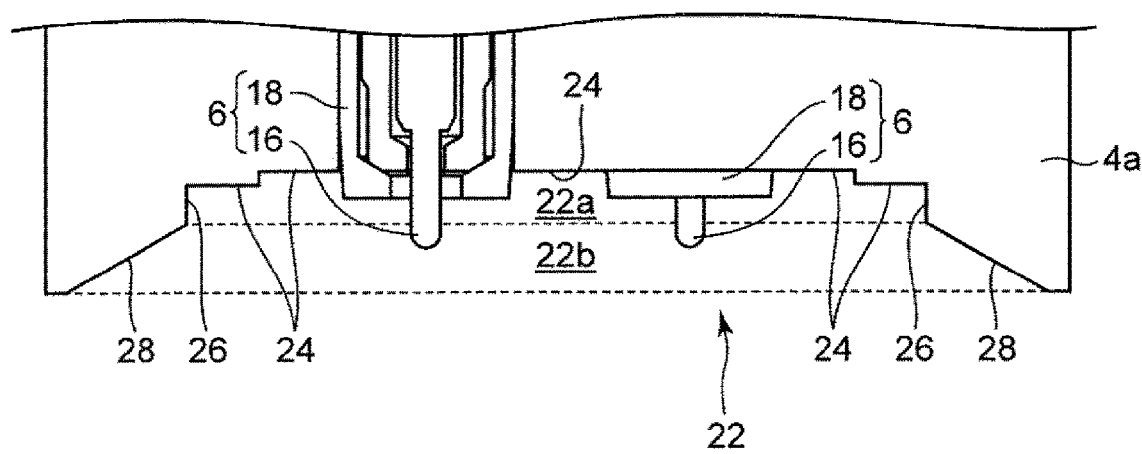
FIG. 7 is a partial schematic longitudinal sectional view illustrating a fitting portion of the plunger.

FIG. 7 is a partial longitudinal sectional view of the fitting portion 4a of the plunger 4. As illustrated in FIG. 7, the groove portion 22, which allows the connector 3 to be fitted thereto, is formed in the fitting portion 4a of the plunger 4. Because the groove portion 22 is formed, the fitting portion 4a has an outer shape that is inwardly recessed.

The groove portion 22 according to the first embodiment has a first space 22a and a second space 22b.

The first space 22a, which is a space in which the connector 3 is to be disposed, is formed further inward than the second space 22b. In the first space 22a, the tip portions of the conducting pins 16 of the coaxial probes 6 are exposed.

The second space 22b is a space that is formed further outward than the first space 22a. The second space 22b functions as a space for guiding the connector 3 to the first space 22a, as described below.

The first space 22a is formed by a bottom wall 24 and a first side wall 26 of the fitting portion 4a. The bottom wall 24 is a wall of the fitting portion 4a that forms a bottom surface of the groove portion 22. The bottom wall 24 allows the tip portions of the conducting pins 16 of the coaxial probes 6 to be exposed. The first side wall 26 is a side wall standing on the periphery of the bottom wall 24. The first side wall 26 according to the first embodiment stands perpendicular to the bottom wall 24.

The second space 22b is formed by a second side wall 28 of the fitting portion 4a. The second side wall 28 is a wall that stands on the periphery of the first side wall 26. The second side wall 28 according to the first embodiment extends radially outward in directions away from the first side wall 26. In other words, the second side wall 28 has a tapered shape such that the second side wall 28 is inclined so as to taper inward toward the first space 22a. The second side wall 28, having such a shape, functions as a guide portion that guides the connector 3 toward the first space 22a.

Next, referring to FIGS. 8A and 8B, a method of inspecting characteristics of the terminals 3b by disposing the connector 3 in the groove portion 22 will be described.

Figure 8A:
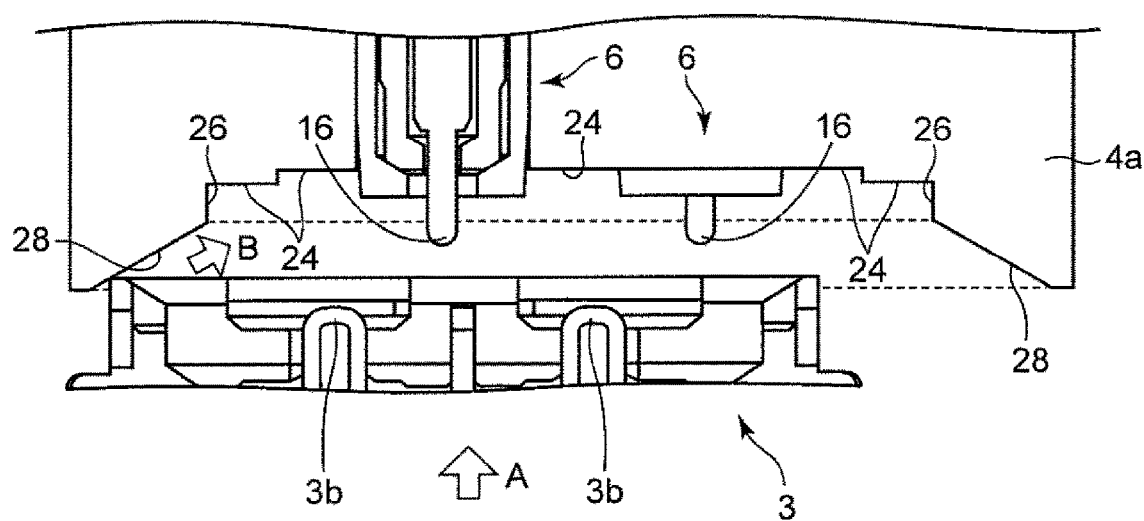
FIG. 8A is a schematic sectional view illustrating a method of inspecting characteristics of terminals by disposing a multipole connector in a groove portion.
Figure 8B:
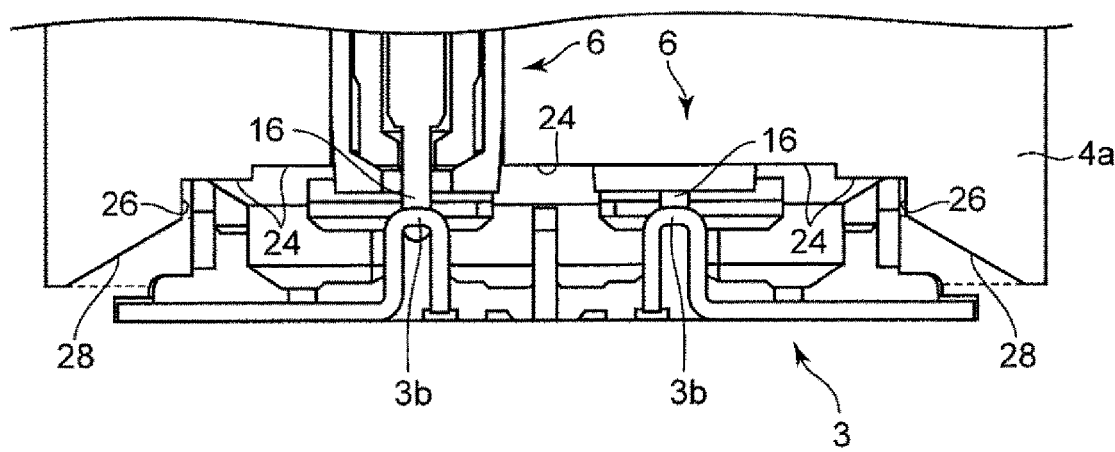
FIG. 8B is a schematic sectional view illustrating a method of inspecting characteristics of the terminals by disposing the multipole connector in the groove portion.

FIGS. 8A and 8B are schematic sectional views illustrating an operation of disposing the connector 3 in the groove portion 22.

As illustrated in FIG. 8A, first, the connector 3 is moved closer to the groove portion 22 (arrow A). Thus, the connector 3 starts to contact the second side wall 28 of the fitting portion 4a (the left side in the figure).

As described above, the second side wall 28 has a tapered shape such that the second side wall 28 is inclined so as to taper inward toward the first space 22a in the first side wall 26. Thus, the connector 3, which is in contact with the second side wall 28, is guided toward the first space 22a (arrow B).

Finally, as illustrated in FIG. 8B, the connector 3 is disposed in the first space 22a in the first side wall 26. The connector 3 is positioned at a predetermined measurement position by being surrounded by the first side wall 26. At this time, the terminals 3b of the connector 3 are in contact with the conducting pins 16 of the coaxial probes 6. Thus, it is possible to simultaneously inspect characteristics of the terminals 3b.

As described above, it is possible to simultaneously inspect characteristics of the plurality of terminals 3b by causing the plurality of coaxial probes 6 to simultaneously contact the plurality of terminals 3b of the connector 3. Thus, it is possible to simultaneously measure a plurality of signals.

To date, coaxial connectors each having only one terminal has been mainly used to connect, for example, RF signal lines in a mobile phone or a smartphone. In recent years, a plurality of coaxial connectors are arranged and used, because RF signals in a plurality of bands are handled and there are a plurality of RF signal lines. As the density of circuits has increased, the circuits are designed so that RF singles are passed through some terminals of a multipole connector having an irregular shape instead of using a coaxial connector.

In such circumstances, the probe structure 2 according to the first embodiment can function as a measurement probe that can be simultaneously connected the plurality of terminals 3b of the connector 3 and can simultaneously inspect characteristics of a plurality of lines.

As described above, the probe structure 2 according to the first embodiment, which is a probe structure for inspecting characteristics of the connector 3 including the plurality of terminals 3a, includes the plunger 4 and the coaxial probes 6. The plunger 4 includes the groove portion 22 to which the connector 3 is to be fitted. The coaxial probes 6 are inserted into the plunger 4. The conducting pin 16 is disposed at a position corresponding to at least one of the plurality of terminals 3a (in the first embodiment, the three terminals 3b) of the connector 3, which is fitted into the groove portion 22 of the plunger 4.

With such a structure, because one probe structure 2 includes the plurality of coaxial probes 6, it is possible to simultaneously inspect characteristics of the plurality of terminals 3b of the connector 3, which are among the plurality of terminals 3a. Thus, it is possible to simultaneously measure a plurality of signals.

In the probe structure 2 according to the first embodiment, the wall of the plunger 4, which forms the groove portion 22, includes the bottom wall 24, the first side wall 26, and the second side wall 28. The bottom wall 24 allows the tip portions of the conducting pins 16 to be exposed. The first side wall 26 stands on the periphery of the bottom wall 24. The second side wall 28 stands on the periphery of the first side wall 26 and is inclined so as to taper inward toward the first side wall 26.

With such a structure, when the connector 3 contacts the second side wall 28, the connector 3 is guided toward the space in the first side wall 26 and the bottom wall 24. Thus, it is possible to dispose the connector 3 at a desired measurement position with high accuracy. Therefore, it is possible to inspect characteristics of the terminals 3b of the connector 3 with higher accuracy.

Figure 9:
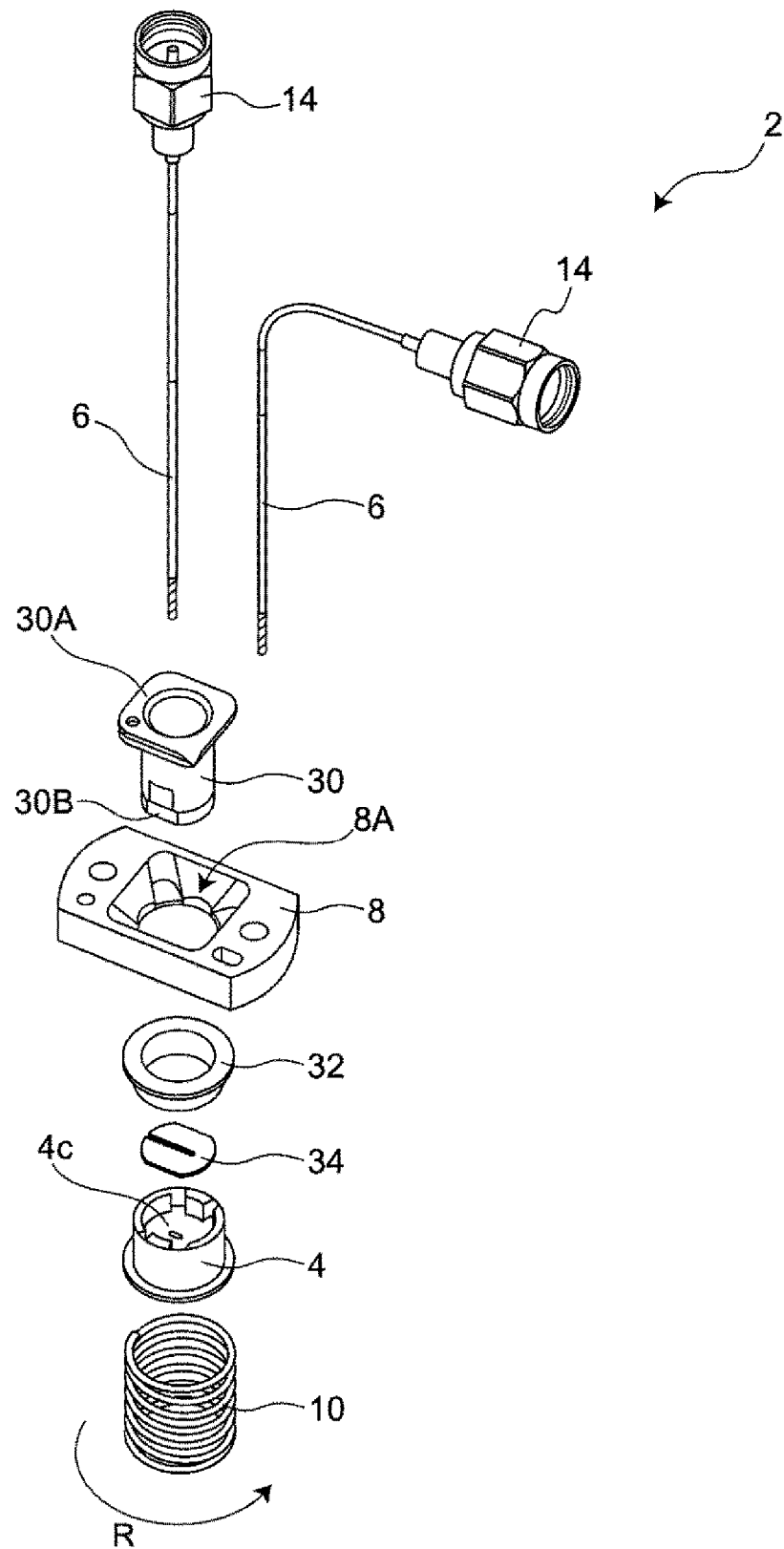
FIG. 9 is an exploded perspective view of the probe structure.
Figure 10:
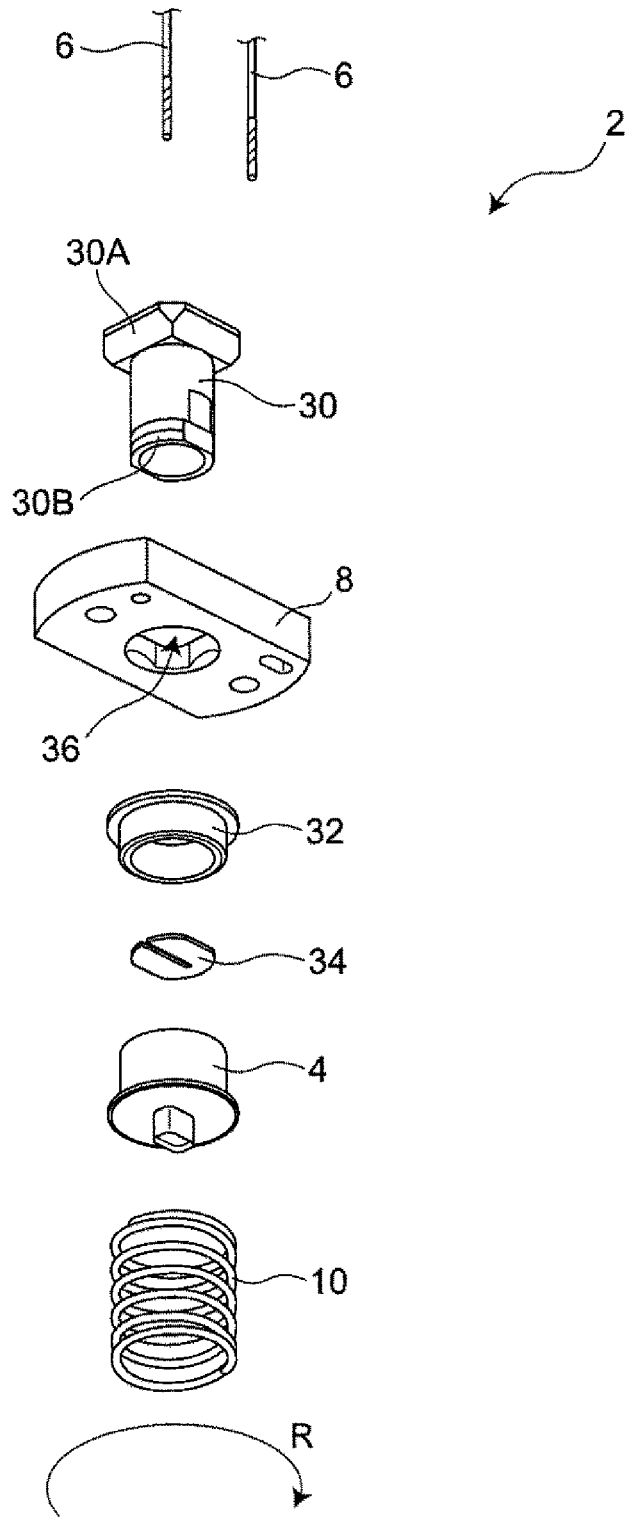
FIG. 10 is an exploded perspective view of the probe structure.
Figure 11:
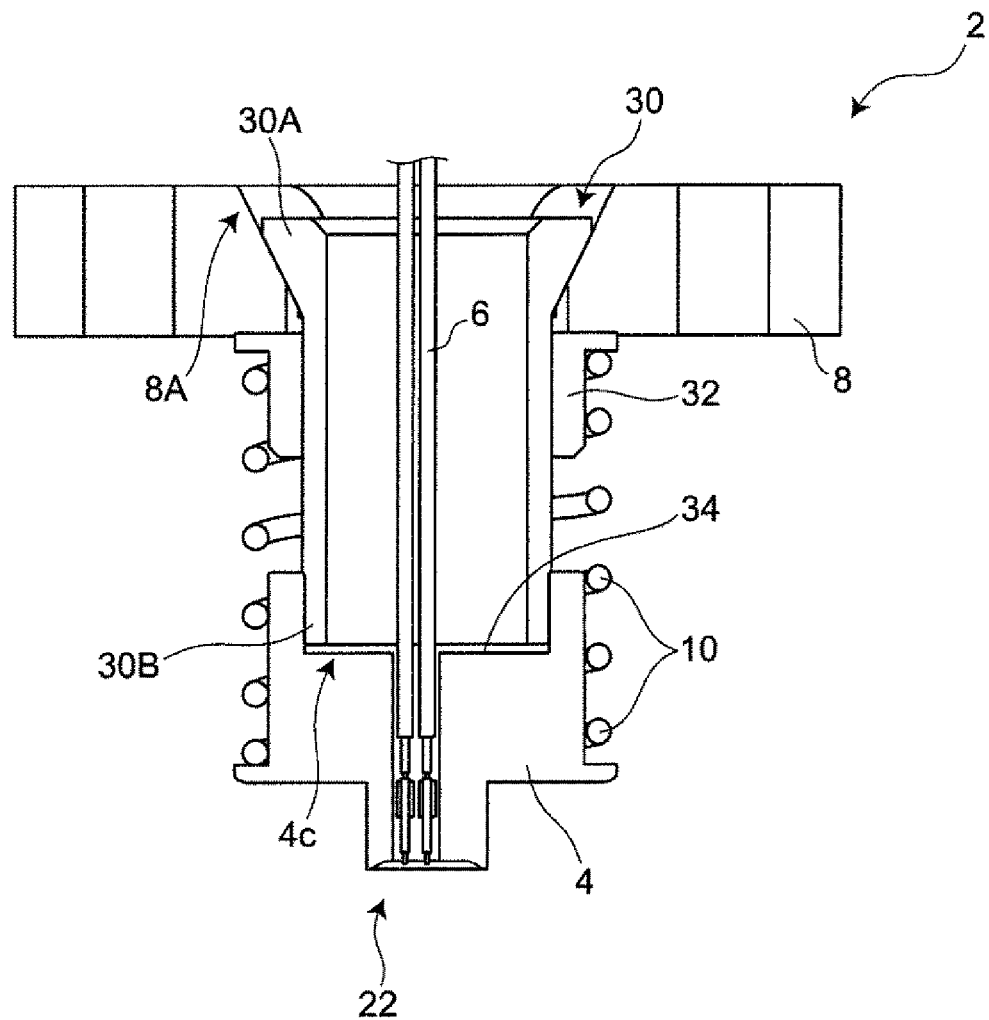
FIG. 11 is a schematic longitudinal sectional view of the probe structure.

Next, referring to FIGS. 9 to 11, the probe structure 2 will be described in more detail. FIGS. 9 and 10 are exploded perspective views of the probe structure 2. FIG. 11 is a schematic longitudinal sectional view of the probe structure 2.

As illustrated in FIGS. 9 to 11, the probe structure 2 further includes a housing 30, a ring 32, and a plate 34, in addition to the plunger 4, the coaxial probes 6, the flange 8, the spring 10, and the connectors 14 described above. The housing 30, the ring 32, and the plate 34 are not illustrated in FIGS. 1 to 8B.

The housing 30 surrounds the coaxial probes 6 and is fitted into a through-hole 8A of the flange 8. The housing 30 has a first end portion 30A (upper end portion) and a second end portion 30B (lower end portion). The first end portion 30A is fitted into the through-hole 8A of the flange 8. The second end portion 30B is fitted into a recessed portion 4c of the plunger 4 described above.

The first end portion 30A has a flared shape whose outer dimension in the horizontal direction is larger than that of the second end portion 30B. The shape of the housing 30 is a hollow tube that surrounds the coaxial probes 6.

FIG. 11 illustrates a state in which the first end portion 30A of the housing 30 is fitted into the through-hole 8A of the flange 8. The second end portion 30B of the housing 30 is fitted to the plunger 4, and the spring 10 is disposed around the housing 30 and the plunger 4. The ring 32 is disposed at a position where the spring 10 and the flange 8 may contact each other. The ring 32, which is interposed between the flange 8 and the housing 30, is used to reduce friction between these. The ring 32 is made of, for example, a low-friction material such as polyacetal (POM). The ring 32 is formed in a hollow tubular shape so as to surround the outer periphery of the housing 30.

The plate 34 is disposed in the recessed portion 4c of the plunger 4 between the second end portion 30B of the housing 30 and the plunger 4. The plate 34 can reduce occurrence of accidental removal of the coaxial probe 6 in an upward direction.

In a state in which the second end portion 30B of the housing 30 is attached to the plunger 4 via the plate 34, the housing 30 and the plunger 4 are fitted to each other so as to be integrally rotatable in the circumferential direction R.

In such a structure, the first embodiment is designed to allow the connector 3 to be positioned in the groove portion 22 of the plunger 4 with high accuracy. Specifics will be described with reference to FIGS. 12A to 15C.

Figure 12A:
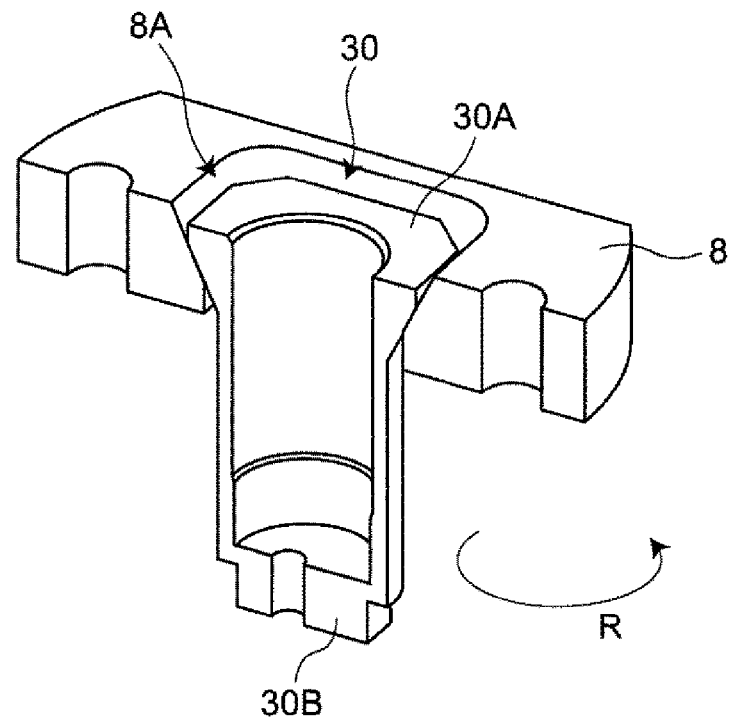
FIG. 12A is a schematic perspective view illustrating a fitted state in which a housing and a flange are fitted to each other.
Figure 12B:
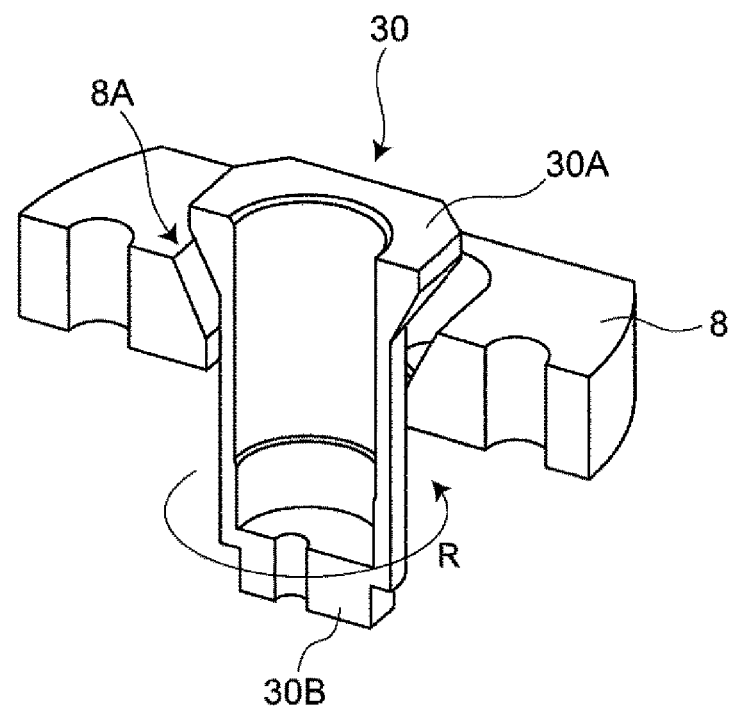
FIG. 12B is a schematic perspective view illustrating an unfitted state in which the housing and the flange are not fitted to each other.

FIG. 12A is a schematic perspective view illustrating a fitted state in which the housing 30 and the flange 8 are fitted to each other. FIG. 12B is a schematic perspective view illustrating an unfitted state in which the housing 30 has moved to a position above the flange 8 and the housing 30 and the flange 8 are not fitted to each other. Components other than the housing 30 and the flange 8 are not illustrated in FIGS. 12A and 12B.

In the fitted state illustrated in FIG. 12A, the first end portion 30A of the housing 30 is fitted into the through-hole 8A of the flange 8. At this time, rotation of the housing 30 in the circumferential direction R is restricted by the flange 8. To be specific, the first end portion 30A and the through-hole 8A each have a tapered shape that tapers inward in the downward direction. In particular, the outer periphery of each of the first end portion 30A and the through-hole 8A in the circumferential direction R has a non-circular shape. In the first embodiment, the shape is a substantially rectangular shape with round corners when seen from above. With such a shape, in the fitted state in which the housing 30 and the flange 8 are fitted to each other, rotation of the housing 30 in the circumferential direction R is restricted by the flange 8. Thus, the first end portion 30A of the housing 30 and the through-hole 8A of the flange 8 have outer shapes that restrict rotation of the housing 30 in the circumferential direction R in the fitted state.

The plunger 4, which is attached to a lower part of the housing 30, is pressed upward by the connector 3 in a state in which the connector 3 is disposed in the groove portion 22. At this time, because the spring 10, which surrounds the plunger 4 and the housing 30, contracts, the housing 30 moves upward relative to the flange 8 as illustrated in FIG. 12B. Thus, the first end portion 30A of the housing 30 enters an unfitted state in which the first end portion 30A is not fitted into the through-hole 8A of the flange 8. In the unfitted state illustrated in FIG. 12B, the flange 8 does not restrict rotation of the housing 30, and the housing 30 is rotatable relative to the flange 8 in the circumferential direction R. Thus, the housing 30 and the plunger 4 can rotate in accordance with the positions of the terminals of the connector 3. Specifics will be described with reference to FIGS. 13 to 15.

Figure 13A:
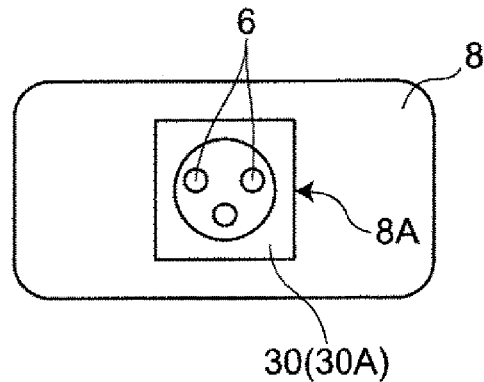
FIGS. 13A-13C schematically illustrate the positional relationship among components when positioning a connector by disposing the connector in the groove portion of the plunger.

FIGS. 13A to 15C schematically illustrate the positional relationship among components when positioning the connector 3 by disposing the connector 3 in the groove portion 22 of the plunger 4. FIG. 13A is a schematic top view of the flange 8 and the housing 30, FIG. 13B is a schematic side view of the probe structure 2 and the connector 3, and FIG.

13C is a schematic view illustrating the rotational positions of the groove portion 22 of the plunger 4 and the connector 3.

Figure 13B:
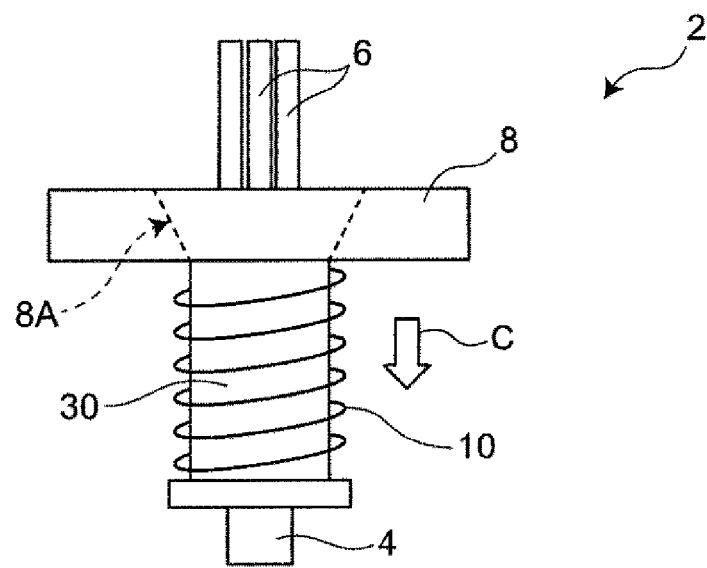
Figure 13B:
Figure 13C:
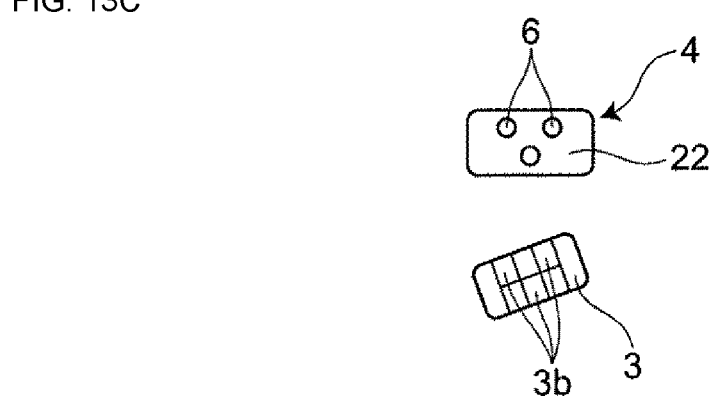

FIGS. 13A-13C illustrate a state in which the probe structure 2 moves closer to the connector 3 from above. The connector 3 is fixed by a jig 38. As illustrated in FIG. 13(b), because the plunger 4 is not in contact with the connector 3, the plunger 4 and the spring 10 do not receive an upward pressing force from the connector 3. The spring 10, which does not receive a pressing force from the connector 3, urges the plunger 4 downward (arrow C), which is a direction away from the flange 8. The plunger 4 and the housing 30 are urged downward by the spring 10, and the fitted state of the housing 30 and the flange 8 is maintained. Because this is the fitted state described above and illustrated in FIG. 12A, rotation of the housing 30 in the circumferential direction R is restricted. By moving the plunger 4 closer to the connector 3 in this state, it is possible to move the plunger 4 closer to the connector 3 while fixing the rotational positions of the housing 30 and the plunger 4 and to position the connector 3 with high accuracy.

As illustrated in FIG. 13C, the rotational position of the connector 3 in top view does not coincide with the rotational position of the groove portion 22 of the plunger 4.

Figure 14A:
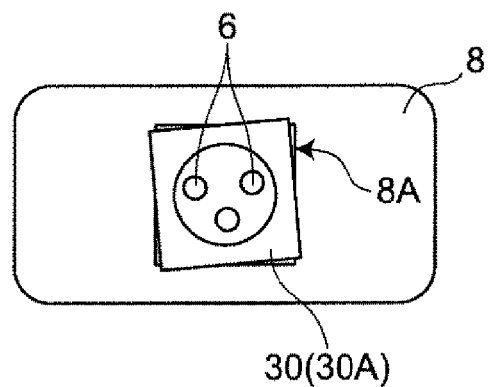
FIGS. 14A-14C schematically illustrate the positional relationship among the components when positioning the connector by disposing the connector in the groove portion of the plunger.
Figure 14B:
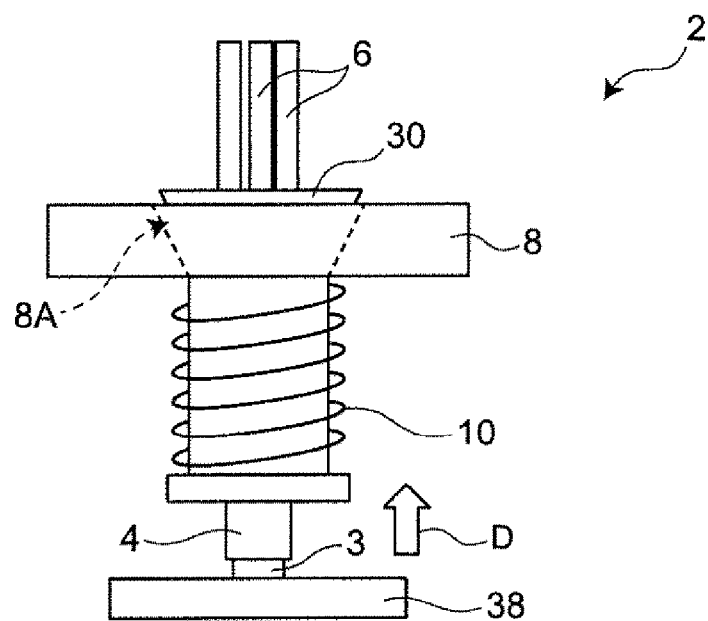
Figure 14C:
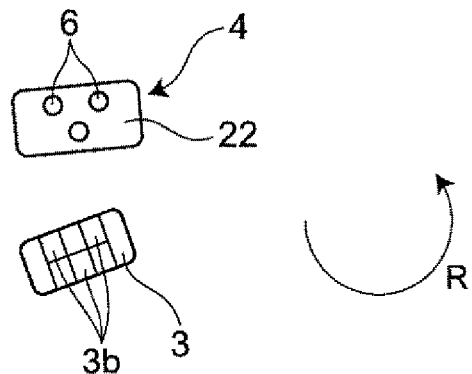

When the plunger 4 is moved closer to the connector 3, as illustrated in FIGS. 14A-14C, the connector 3 enters the groove portion 22 of the plunger 4 and the plunger 4 contacts the connector 3. When the plunger 4 is pressed downward against the connector 3, because the connector 3 is fixed by the jig 38, the plunger 4 receives an upward reactional force from the connector 3 (see arrow D). Due to the reactional force, the plunger 4 is pressed upward. When the plunger 4 is pressed upward, because the spring 10 contracts as described with reference to FIG. 12B, the plunger 4 and the housing 30 move upward, and the fitted state of the housing 30 and the flange 8 is released. Because this is the unfitted state described above and illustrated FIG. 12B, rotation of the housing 30 is not restricted by the flange 8, and the housing 30 becomes rotatable in the circumferential direction R.

As described above with reference to FIG. 7 and other figures, in the groove portion 22 of the plunger 4, the second side wall 28, which is a guide portion that guides the connector 3 inward, is disposed. Therefore, when the groove portion 22 of the plunger 4 starts contacting the connector 3, as illustrated in FIGS. 14(a) and 14(b), the plunger 4 and the housing 30 rotate in the circumferential direction R so that the rotational positions thereof become closer to that of the connector 3. At this time, the spring 10 and the ring 32 (FIG. 11) also rotate in the same manner.

Figure 15A:
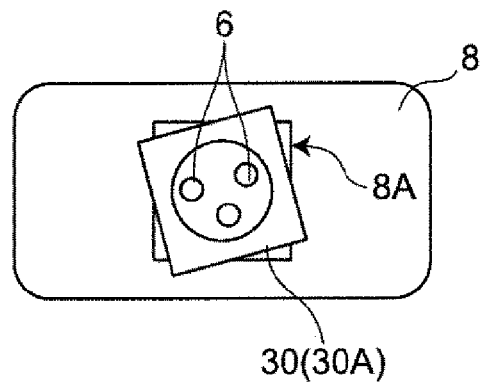
FIGS. 15A-15C schematically illustrate the positional relationship among the components when positioning the connector by disposing the connector in the groove portion of the plunger.
Figure 15B:
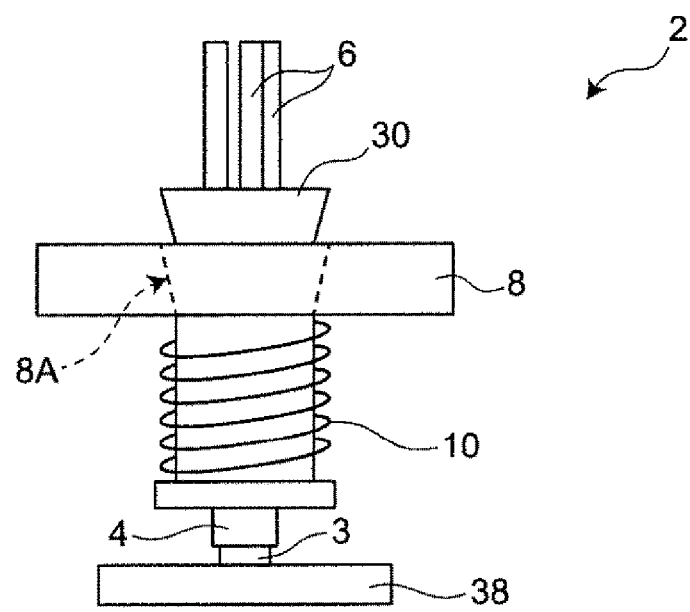
Figure 15C:
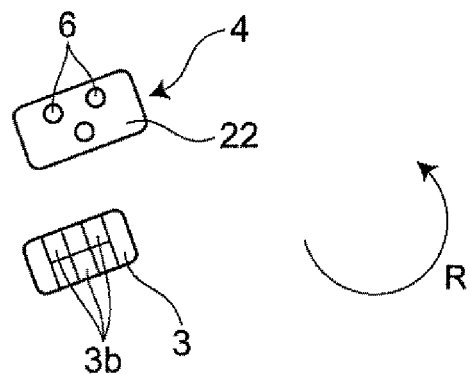

When the plunger 4 is further pressed against the connector 3, the plunger 4 and the housing 30 rotate further in the circumferential direction R and finally enter a state illustrated in FIGS. 15A-15C. In the state illustrated in FIG. 15C, the rotational position of the groove portion 22 of the plunger 4 coincides with the rotational position of the connector 3. At this time, the three coaxial probes 6, which are exposed in the groove portion 22, are disposed at positions corresponding to the terminals 3b of the connector 3 and can reliably contact the terminals 3b. Because the coaxial probes 6 and the terminals 3b of the connector 3 can be made to contact each other with high accuracy in this way, it is possible to improve the accuracy of inspection of characteristics of the connector 3.

As described above, with the probe structure 2 according to the first embodiment, rotation of the housing 30 is restricted in a state in which the housing 30 and the flange 8 are fitted to each other. On the other hand, the restriction on rotation of the housing 30 is removed in a state in which the housing 30 and the flange 8 are not fitted to each other. To be specific, the first end portion 30A of the housing 30 and the through-hole 8A of the flange 8 have outer shapes that restrict rotation of the housing 30 in the circumferential direction R in a state in which the first end portion 30A of the housing 30 is fitted into the through-hole 8A of the flange 8. With such a structure, it is possible to cause the coaxial probes 6 to contact the terminals 3b of the connector 3 with high accuracy and to improve the reliability of inspection of characteristics.

To be more specific, because the plunger 4 is urged by the spring 10, the housing 30, which is attached to the plunger 4, is constantly urged in a direction such that the housing 30 is fitted to the flange 8. Thus, when positioning the connector 3 in the groove portion of the plunger 4, it is possible to perform positioning in a state in which the rotational positions of the plunger 4 and the housing 30 are fixed. Therefore, it is possible to position the connector 3 with high accuracy. When the connector 3 is pressed against the plunger 4 in a state in which the connector 3 is disposed in the groove portion of the plunger 4, because the spring 10 contracts, the fitted state of the housing 30 and the flange 8 is released, and the plunger 4 and the housing 30 become rotatable. Thus, the plunger 4 and the housing 30 can rotate in accordance with the positions of the terminals 3b of the connector 3, the coaxial probes 6 can contact the terminals 3b of the connector 3 with high accuracy, and it is possible to improve the accuracy of inspection of characteristics.

With the probe structure 2 according to the first embodiment, the first end portion 30A of the housing 30 has a tapered shape that tapers inward toward the second end portion 30B. The through-hole 8A of the flange 8 has an inclined shape that receives the first end portion 30A of the housing 30. Thus, a rotation-restricting mechanism that restricts rotation of the housing 30 is formed by utilizing the outer shapes of the housing 30 and the through-hole 8A of the flange 8. With such a structure, it is not necessary to provide the flange 8 or the housing 30 with a projection or the like, and it is possible to realize a rotation-restricting mechanism of the housing 30 with a simple structure.

Next, referring to FIGS. 16 and 17, the structure of the second side wall 28, which guides the connector 3 inward in the groove portion 22, will be described.

Figure 16:
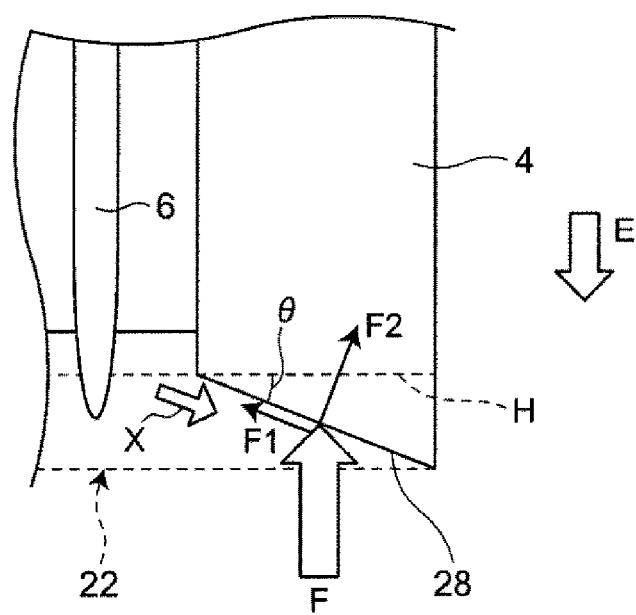
FIG. 16 is a schematic longitudinal sectional view of a second side wall of the groove portion.

As illustrated in FIG. 16, when the plunger 4 moves downward (see arrow E) and the connector 3 (not shown) contacts the second side wall 28 of the groove portion 22, the connector 3 applies an upward external force F to the second side wall 28. The external force F can be decomposed into a force F1 in a direction parallel to the second side wall 28 and a force F2 in a direction perpendicular the second side wall 28. The force F2 is received by the second side wall 28, while the force F1 serves as a driving force that slides the connector 3 along the second side wall 28. In response, a frictional force X is generated along the second side wall 28 in a direction opposite to the direction of the force F1.

In the first embodiment, in order that the connector 3 can slide along the second side wall 28 without fail, the inclination angle θ of the second side wall 28 is calculated so that the force F1 is larger than the frictional force X. To be specific, because the frictional force X is determined by a friction coefficient μ, which depends on the material of the second side wall 28, the inclination angle θ is set so as to satisfy the relationship represented by the following Expression 1. Here, the inclination angle θ of the second side wall 28 is the inclination angle of the second side wall 28 with respect to a horizontal plane H.

$$\theta > \tan \mu (\text{rad}) = (180 * \tan \mu)/\pi (\text{degrees}) \quad \text{(Expression 1)}$$

Figure 17:
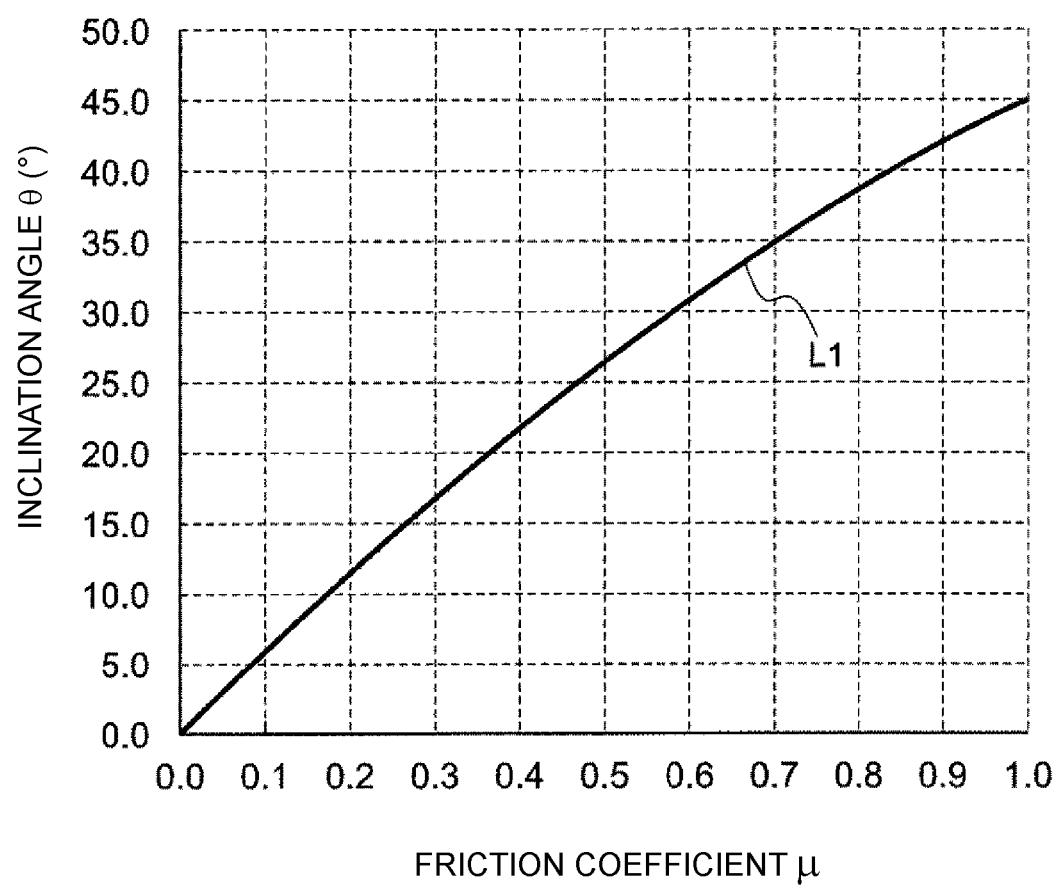
FIG. 17 is a graph representing the relationship between the friction coefficient and the inclination angle of the second side wall.

FIG. 17 represents the relationship between the friction coefficient μ and the inclination angle θ obtained from Expression 1. FIG. 17 illustrates a line L1 corresponding to the relationship between the friction coefficient μ and the inclination angle θ such that the force F1 is equal to the frictional force X, which is obtained from Expression 1. In the graph of FIG. 17, by setting an inclination angle θ above the line L1 for a certain friction coefficient μ, it is possible to make the force F1 larger than the frictional force X without fail and to move the connector 3 along the second side wall 28 without fail.

As described above, in the probe structure 2 according to the first embodiment, the inclination angle θ of the second side wall 28 is set based on the friction coefficient μ of the material of the second side wall 28. To be more specific, the inclination angle θ of the second side wall 28 is set at an angle that is larger than a lower limit value (line L1) that is obtained from the friction coefficient μ by using Expression 1. By setting the angle in this way, the connector 3 can be reliably guided along the second side wall 28, and it is possible to further improve the positioning accuracy of the connector 3.

For example, in a case where the material of the second side wall 28 is stainless steel, the friction coefficient of the material is about 0.3. In this case, according to the graph of FIG. 17, the inclination angle θ may be set at 16.7 degrees or larger. To provide a margin, the inclination angle θ may be set, for example, at 20 degrees or larger. In a case where the friction coefficient is 0.5, because the inclination angle θ may be set at 26.6 degrees or larger according to the graph of FIG. 17, the inclination angle θ may be set, for example, at 30 degrees or larger to provide a margin.

(Second Embodiment)

Figure 18:
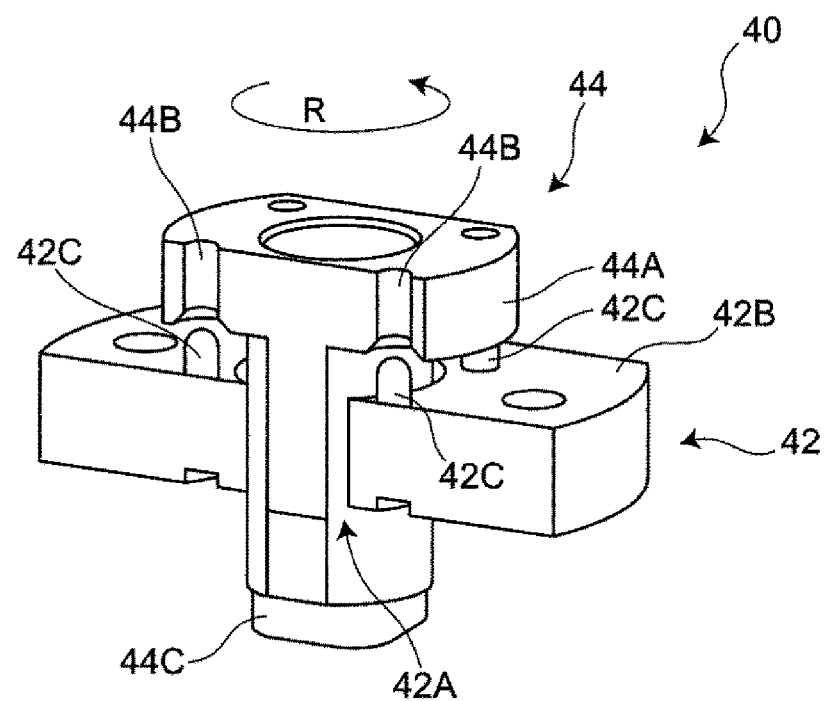
FIG. 18 is a schematic perspective view of a probe structure according to a second embodiment.

Referring to FIG. 18, a probe structure 40 according to a second embodiment of the present disclosure will be described. The differences between the second embodiment and the first embodiment will be mainly described.

FIG. 18 is a schematic perspective view of a flange 42 and a housing 44 of the probe structure 40 according to the second embodiment. Components other than the flange 42 and the housing 44 are not illustrated in FIG. 18.

As illustrated in FIG. 18, the flange 42 has a through-hole 42A, and the housing 44 is inserted into the through-hole 42A. The housing 44 has a first end portion 44A and a second end portion 44C. A plurality of grooves 44B are formed in the first end portion 44A of the housing 44. In the example illustrated in FIG. 18, the grooves 44B are formed at four positions at intervals in the circumferential direction R. The grooves 44B are through-holes that vertically extend through the first end portion 44A.

The flange 42 has a plurality of projections 42C on a surface 42B on a side that receives the first end portion 44A of the housing 44. The projections 42C are located around the through-hole 42A. The plurality of projections 42C are fitted into the plurality of grooves 44B of the first end portion 44A of the housing 44. As with the grooves 44B, the plurality of projections 42C are arranged at a plurality of positions at intervals in the circumferential direction R. In the example illustrated in FIG. 18, the grooves 44B are formed at four positions corresponding to the plurality of projections 42C at intervals in the circumferential direction R. In the example illustrated in FIG. 18, each of the projections 42C has a columnar shape having a rounded tip.

When the housing 44 moves downward toward the flange 42 from the state illustrated in FIG. 18 and the projections 42C are fitted into the grooves 44B, rotation of the housing 44 in the circumferential direction R is restricted by the flange 42.

With the structure described above, because a rotation-restricting mechanism of the housing 44 is formed from the grooves 44B and the projections 42C, rotation of the housing 44 can be more reliably restricted. In particular, in the second embodiment, the projections 42C of the flange 42 and the grooves 44B of the housing 44 are respectively arranged at a plurality of positions in the circumferential direction R. Thus, it is possible to more reliably restrict rotation of the housing 44.

(Third Embodiment)

Figure 19:
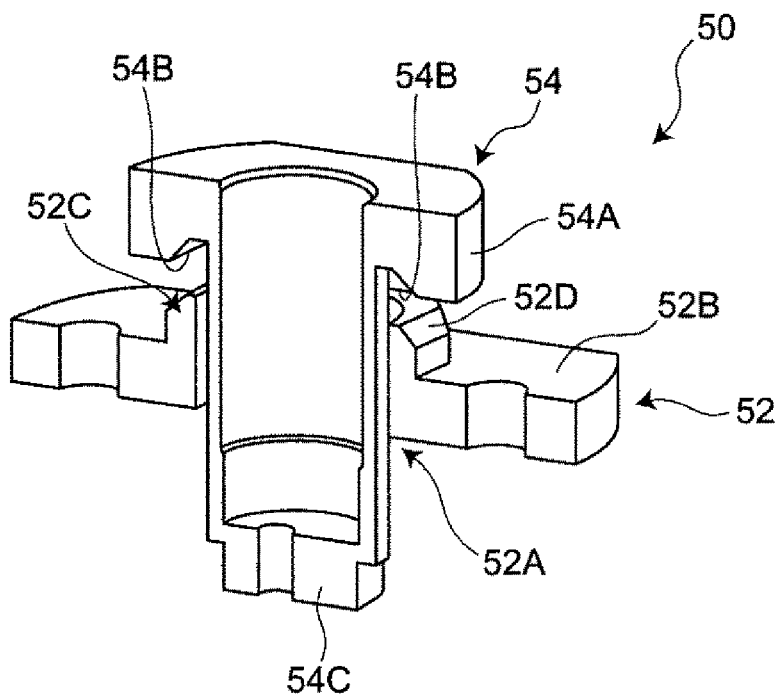
FIG. 19 is a schematic perspective view of a probe structure according to a third embodiment.

Referring to FIG. 19, a probe structure according to a third embodiment of the present disclosure will be described. The differences between the third embodiment and the first and second embodiments will be mainly described.

FIG. 19 is a schematic perspective view of a flange 52 and a housing 54 of a probe structure 50 according to the third embodiment. Components other than the flange 52 and the housing 54 are not illustrated in FIG. 19.

As illustrated in FIG. 19, the flange 52 has a through-hole 52A, and the housing 54 is inserted into the through-hole 52A. The housing 54 has a first end portion 54A and a second end portion 54C. A groove 54B is formed in the first end portion 54A of the housing 54. The groove 54B is formed continuously in the circumferential direction R. The groove 54B is a recessed portion that is recessed inward in a lower surface of the first end portion 54A.

The flange 52 has a projection 52C on a surface 52B on a side that receives the first end portion 54A of the housing 54. The projection 52C is located around the through-hole 52A. The projection 52C is fitted into the groove 54B of the first end portion 54A of the housing 54. As with the groove 54B, the projection 52C is formed continuously in the circumferential direction R. In the example illustrated in FIG. 19, the tip portion of the projection 52C has an inclined surface 52D that is inclined diagonally downward and outward.

When the housing 54 moves downward toward the flange 52 from the state illustrated in FIG. 19 and the projection 52C is fitted into the groove 54B, rotation of the housing 54 in the circumferential direction R is restricted by the flange 52.

With the structure described above, in the same way as in the second embodiment, because a rotation-restricting mechanism of the housing 54 is formed from the groove 54B and the projection 52C, rotation of the housing 54 can be more reliably restricted. In particular, in the third embodiment, the projection 52C of the flange 52 and the groove 54B of the housing 54 are each formed continuously in the circumferential direction R. Thus, it is possible to realize a rotation-restricting mechanism for the housing 54 with a simpler structure than in a case where the groove and the projection are each divided into portions that are arranged at a plurality of positions, as in the second embodiment.

A part of the projection 52C that contacts the first end portion 54A of the housing 54 is the inclined surface 52D, which is inclined diagonally downward. Thus, when the housing 54 moves to a position that is only slightly above from the flange 52, the housing 54 becomes rotatable. Thus, it is possible to further improve positioning accuracy.

Heretofore, the present disclosure has been described by using the first to third embodiments as examples. However, the present disclosure is not limited to the first to third embodiments. For example, each of the first to third embodiments includes three coaxial probes 6, and inspection of characteristics of the corresponding terminals 3b of the connector 3 is simultaneously performed. However, this is not a limitation. A probe structure may have one, two, four, or more coaxial probes 6 in accordance with the number of terminals 3a of the connector 3 whose characteristics are to be inspected. The connector 3 is not limited to a multipole connector having a plurality of terminals 3a and may be a monopole connector having only one terminal. That is, a probe structure may have one or more coaxial probes 6 in each of which a conducting pin 16 is disposed at a position corresponding to at least one of the terminals 3a of the connector 3. Also in such a case, advantageous effects that are the same as those of the embodiments can be obtained.

In each of the first to third embodiments, the first space 22a and the second space 22b, which is inclined so as to taper inward toward the first space 22a, are formed in the groove portion 22. However, this is not a limitation. For example, the second space 22b need not be formed. Also in such a case, it is possible to inspect characteristics of the terminals 3b by disposing the connector 3 in the first space 22a. However, by forming the second space 22b that is inclined so as to taper inward toward the first space 22a as in the embodiments, it is possible to easily dispose the connector 3 in the first space 22a and to improve the reliability of the inspection of characteristics of the terminals 3b.

Although the present disclosure is sufficiently described in relation to preferred embodiments while referring to the drawings, it is clear for persons skilled in the art that the embodiments can be modified or adjusted in various ways. Such modifications and adjustments are included in the scope of the present disclosure as long as the modifications and the adjustments are within the scope of the present disclosure. Combinations and changes in the order of components in the embodiments can be realized within the sprit and scope of the present disclosure.

Any of the first to third embodiments and modifications may be used in appropriate combinations to obtain the advantageous effects of the embodiments and the modifications.

What is claimed is:

1. A probe structure for inspecting characteristics of a connector including at least one terminal, the probe structure comprising:
    a plunger that includes a groove portion to which the connector is to be fitted;
    a coaxial probe that is inserted into the plunger and that allows a conductor pin to be exposed at a position corresponding to the terminal of the connector that is fitted into the groove portion of the plunger;
    a flange that is fixed to an apparatus for inspecting the characteristics at a position that is spaced apart on a side opposite to a side on which the conducting pin is exposed with respect to the plunger, the flange having a through-hole into which the coaxial probe is inserted;
    a housing that includes a first end portion and a second end portion and that extends toward the plunger while surrounding the coaxial probe, the first end portion being fitted into the through-hole of the flange from a side opposite to a side on which the plunger is disposed, the second end portion being attached to the plunger; and
    a spring that is attached to a portion between the plunger and the flange, that is disposed at a position surrounding the housing, and that urges the plunger in a direction away from the flange,
    wherein the first end portion of the housing and the through-hole of the flange have outer shapes that restrict rotation of the housing in a circumferential direction in a state in which the first end portion of the housing is fitted into the through-hole of the flange.

2. The probe structure according to claim 1, wherein the first end portion of the housing has a tapered shape that tapers inward toward the second end portion, and the through-hole of the flange has an inclined shape that receives the first end portion of the housing.

3. The probe structure according to claim 2, wherein a wall portion of the plunger that forms the groove portion includes a bottom wall that allows a tip portion of the conducting pin to be exposed, a first side wall that stands on a periphery of the bottom wall, and a second side wall that stands on a periphery of the first side wall and that is inclined so as to taper inward toward the first side wall.

4. The probe structure according to claim 3, wherein an inclination angle of the second side wall is set based on a friction coefficient of a material of the second side wall.

5. The probe structure according to claim 1, wherein a wall portion of the plunger that forms the groove portion includes a bottom wall that allows a tip portion of the conducting pin to be exposed, a first side wall that stands on a periphery of the bottom wall, and a second side wall that stands on a periphery of the first side wall and that is inclined so as to taper inward toward the first side wall.

6. The probe structure according to claim 5, wherein an inclination angle of the second side wall is set based on a friction coefficient of a material of the second side wall.

* * * * *